(12) United States Patent
Park et al.

(10) Patent No.: US 11,043,456 B2
(45) Date of Patent: Jun. 22, 2021

(54) SEMICONDUCTOR DEVICES

(71) Applicant: Samsung Electronics Co., Ltd., Suwon-si (KR)

(72) Inventors: Jinho Park, Suwon-si (KR); Shaofeng Ding, Suwon-si (KR); Yongseung Bang, Suwon-si (KR); Jeong Hoon Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/660,124

(22) Filed: Oct. 22, 2019

(65) Prior Publication Data
US 2020/0350248 A1 Nov. 5, 2020

(30) Foreign Application Priority Data
May 3, 2019 (KR) .......................... 10-2019-0052419

(51) Int. Cl.
*H01L 23/535* (2006.01)
*H01L 27/108* (2006.01)

(52) U.S. Cl.
CPC .......... *H01L 23/535* (2013.01); *H01L 27/108* (2013.01)

(58) Field of Classification Search
CPC ..... H01L 23/535; H01L 27/108; H01L 28/60; H01L 27/224; H01L 21/31116; H01L 23/5223; H01L 23/5226; H01L 21/76805; H01L 21/76804; H01L 21/32136; H01L 21/32131; H01L 28/40; H01L 28/75
See application file for complete search history.

(56) References Cited

U.S. PATENT DOCUMENTS

| | | | |
|---|---|---|---|
| 7,884,409 B2 | 2/2011 | Kim et al. | |
| 9,064,927 B2 | 6/2015 | Kageyama | |
| 9,219,110 B2 | 12/2015 | Wang et al. | |
| 9,627,312 B2 | 4/2017 | Childs et al. | |
| 9,761,655 B1 | 9/2017 | Ando et al. | |
| 2009/0141426 A1* | 6/2009 | Hwang | H01L 21/8221 361/321.2 |
| 2009/0200638 A1* | 8/2009 | Smith | H01L 21/76816 257/532 |
| 2010/0224960 A1* | 9/2010 | Fischer | H01L 23/5223 257/532 |
| 2012/0199946 A1* | 8/2012 | Kageyama | H01L 21/76816 257/532 |
| 2013/0270675 A1* | 10/2013 | Childs | H01L 23/5226 257/532 |

(Continued)

*Primary Examiner* — Bitew A Dinke
(74) *Attorney, Agent, or Firm* — Harness, Dickey & Pierce, P.L.C.

(57) ABSTRACT

A semiconductor device includes a substrate, a first electrode including a first hole, a first dielectric layer on an upper surface of the first electrode and on an inner surface of the first hole, a second electrode on the first dielectric layer, a second dielectric layer on the second electrode, a third electrode on the second dielectric layer and including a second hole, and a first contact plug extending through the second electrode and the second dielectric layer and extending through the first hole and the second hole. A sidewall of the first contact plug is isolated from direct contact with the sidewall of the first hole and a sidewall of the second hole, and has a step portion located adjacent to an upper surface of the second electrode.

20 Claims, 11 Drawing Sheets

(56) References Cited

U.S. PATENT DOCUMENTS

| | | | |
|---|---|---|---|
| 2014/0159200 A1* | 6/2014 | Loke | H01L 23/5223 |
| | | | 257/532 |
| 2015/0102459 A1* | 4/2015 | Lai | H01L 22/32 |
| | | | 257/532 |
| 2015/0294936 A1* | 10/2015 | Shen | H01L 28/60 |
| | | | 257/532 |
| 2016/0071651 A1* | 3/2016 | Kurosawa | H01G 4/306 |
| | | | 361/304 |
| 2016/0104762 A1* | 4/2016 | Triyoso | H01L 27/0805 |
| | | | 257/532 |
| 2017/0110402 A1* | 4/2017 | Smith | H01L 21/76805 |
| 2018/0226339 A1 | 8/2018 | Kim et al. | |
| 2019/0013269 A1* | 1/2019 | Zhang | H01L 23/5223 |
| 2019/0131385 A1* | 5/2019 | Huang | H01G 4/012 |
| 2019/0148072 A1* | 5/2019 | Fox, III | H01L 28/92 |
| | | | 361/301.4 |
| 2019/0221515 A1* | 7/2019 | Gu | H01L 23/5223 |
| 2019/0333983 A1* | 10/2019 | Rubin | H01L 28/40 |
| 2019/0341347 A1* | 11/2019 | Li | H01L 23/5223 |
| 2020/0035779 A1* | 1/2020 | Huang | H01L 21/32131 |
| 2020/0211955 A1* | 7/2020 | Rubin | H01L 21/76877 |
| 2020/0227348 A1* | 7/2020 | Lin | H01L 28/40 |
| 2020/0273746 A1* | 8/2020 | Lin | H01L 23/5223 |

* cited by examiner

SEMICONDUCTOR DEVICES

CROSS-REFERENCE TO RELATED APPLICATION

This application claims priority under 35 U.S.C. § 119 to Korean Patent Application No. 10-2019-0052419 filed on May 3, 2019 in the Korean Intellectual Property Office, the disclosure of which is hereby incorporated by reference in its entirety.

BACKGROUND

Technical Field

Example embodiments of the present disclosure relate to semiconductor devices, and more specifically, to metal-insulator-metal (MIM) capacitors.

Discussion of Related Art

As integration density of semiconductor devices, for example, dynamic random access memory (DRAM) devices, increases, an area of unit cells in the semiconductor devices is reduced, and thus an area of one or more capacitors in the semiconductor devices also is reduced. However, to integrate the semiconductor device, capacitance of the capacitors may be desired to be increased.

When a thickness of capacitor dielectric layers of capacitors are reduced to increase the capacitance of the capacitors, the leakage current of the capacitors may increase. Accordingly, high dielectric layers may be applied as the capacitor dielectric layers of the capacitors. However, when the high dielectric layers are used as the capacitor dielectric layers in the capacitors, a lower dielectric layer may be formed between the high dielectric layer and an upper electrode of the capacitor, where the upper electrode is formed of polysilicon. As a result, a desired capacitance of the capacitor may not be obtained.

Accordingly, a metal-insulator-metal (MIM) capacitor may be used in a semiconductor device instead of a metal-insulator-semiconductor (MIS) capacitor.

SUMMARY

According to some example embodiments of the inventive concepts, a semiconductor device may include a substrate, a first electrode including a first hole, a first dielectric layer on an upper surface of the first electrode and filling at least a portion of the first hole, a second electrode on the first dielectric layer, a second dielectric layer on the second electrode, a third electrode on the second dielectric layer, the third electrode including a second hole, and a first contact plug extending through the first hole, the second electrode, the second dielectric layer, and the second hole. A sidewall of the first contact plug may be isolated from direct contact with the first electrode and the third electrode. The sidewall of the first contact plug may have a step portion. The step portion of the sidewall of the first contact plug may be adjacent to an upper surface of the second electrode.

According to some example embodiments of the inventive concepts, a semiconductor device may include a substrate, a first electrode on the substrate, a first dielectric layer on the first electrode, a second electrode on the first dielectric layer, a second dielectric layer on the second electrode, a third electrode on the second dielectric layer, and a first contact plug extending through and contacting the first electrode and the third electrode. The first contact plug may include a first part at least partially between a lower surface of the first electrode and the substrate, a second part at least partially distal from the upper surface of the substrate in relation to an upper surface of the third electrode, and a third part at least partially between an upper surface of the first electrode and a lower surface of the third electrode. A sidewall of the first part may be offset to a sidewall of the third part. The sidewall of the third part may be offset to a sidewall of the second part.

According to some example embodiments of the inventive concepts, a semiconductor device may include a substrate, a first electrode on the substrate, a first dielectric layer on the first electrode, a second electrode on the first dielectric layer, the second electrode including a first hole, a second dielectric layer on the second electrode, the second dielectric layer at least partially filling the first hole, a third electrode on the second dielectric layer, and a first contact plug extending through the first electrode, the first dielectric layer, the first hole, and the third electrode. The first contact plug may cover at least one of an upper surface of the first electrode and an upper surface of the third electrode.

DETAILED DESCRIPTION

Figure 1:
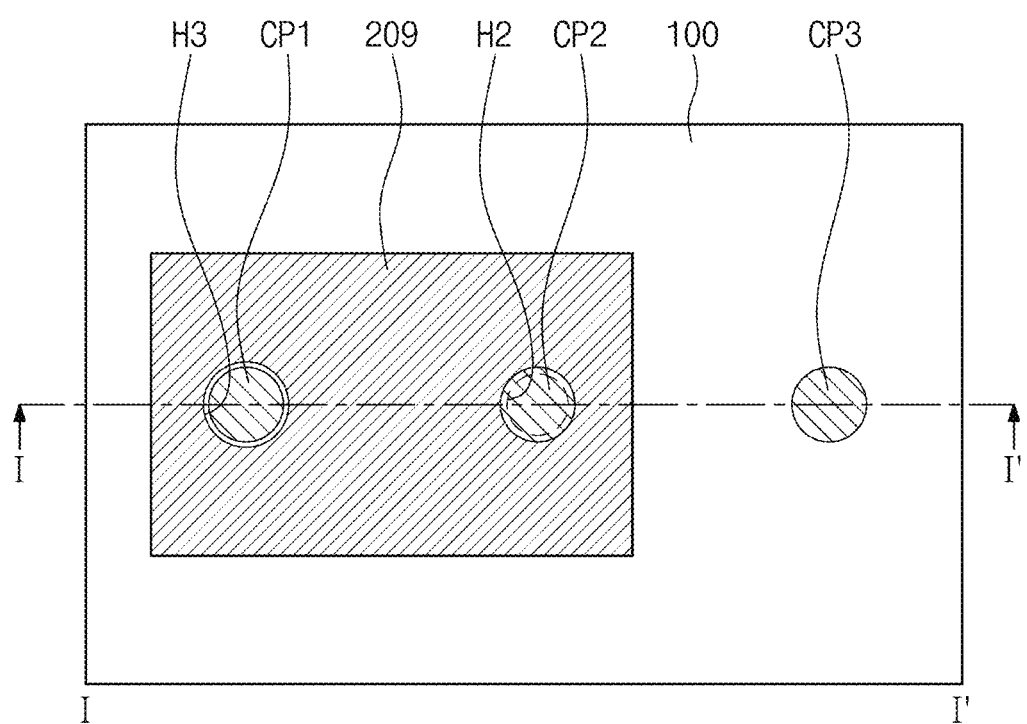
FIG. 1 is a plan view illustrating a semiconductor device according to some example embodiments of the inventive concepts.

Various example embodiments will now be described more fully hereinafter with reference to the accompanying drawings. Like reference numerals may refer to like elements throughout this application.

Figure 2:
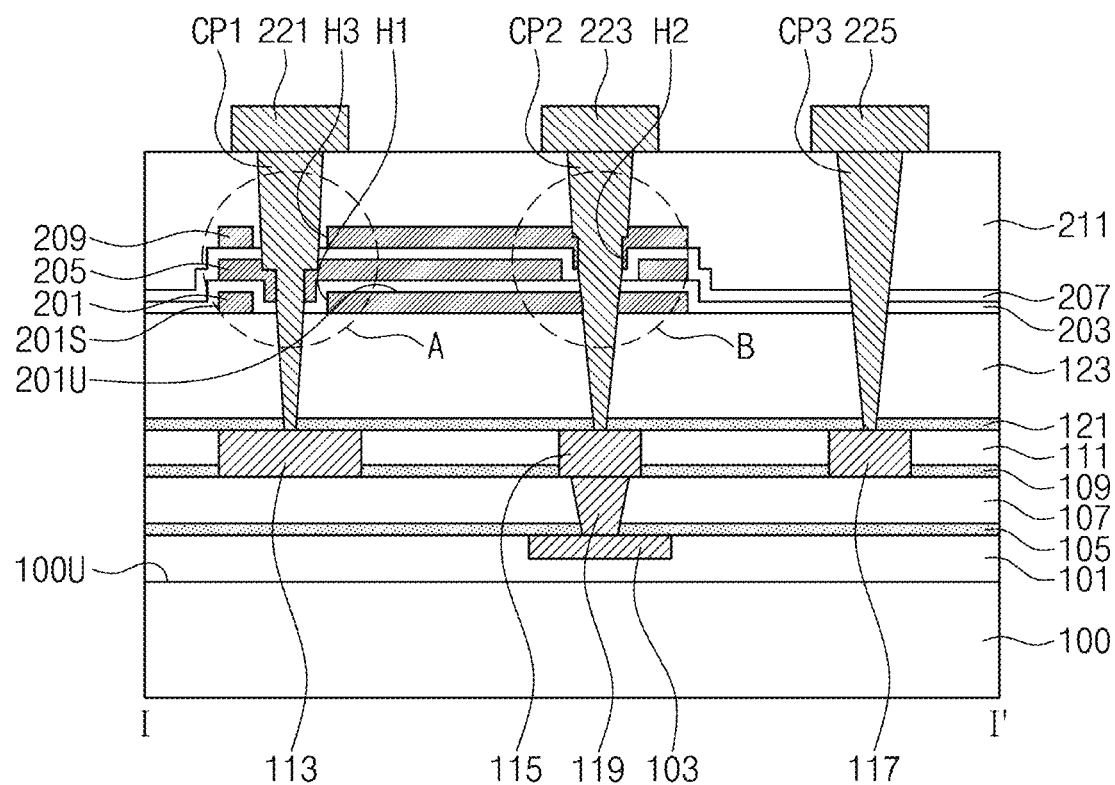
FIG. 2 is a cross-sectional view taken along line I-I' of FIG. 1, illustrating a semiconductor device according to some example embodiments of the inventive concepts.
Figure 3A:
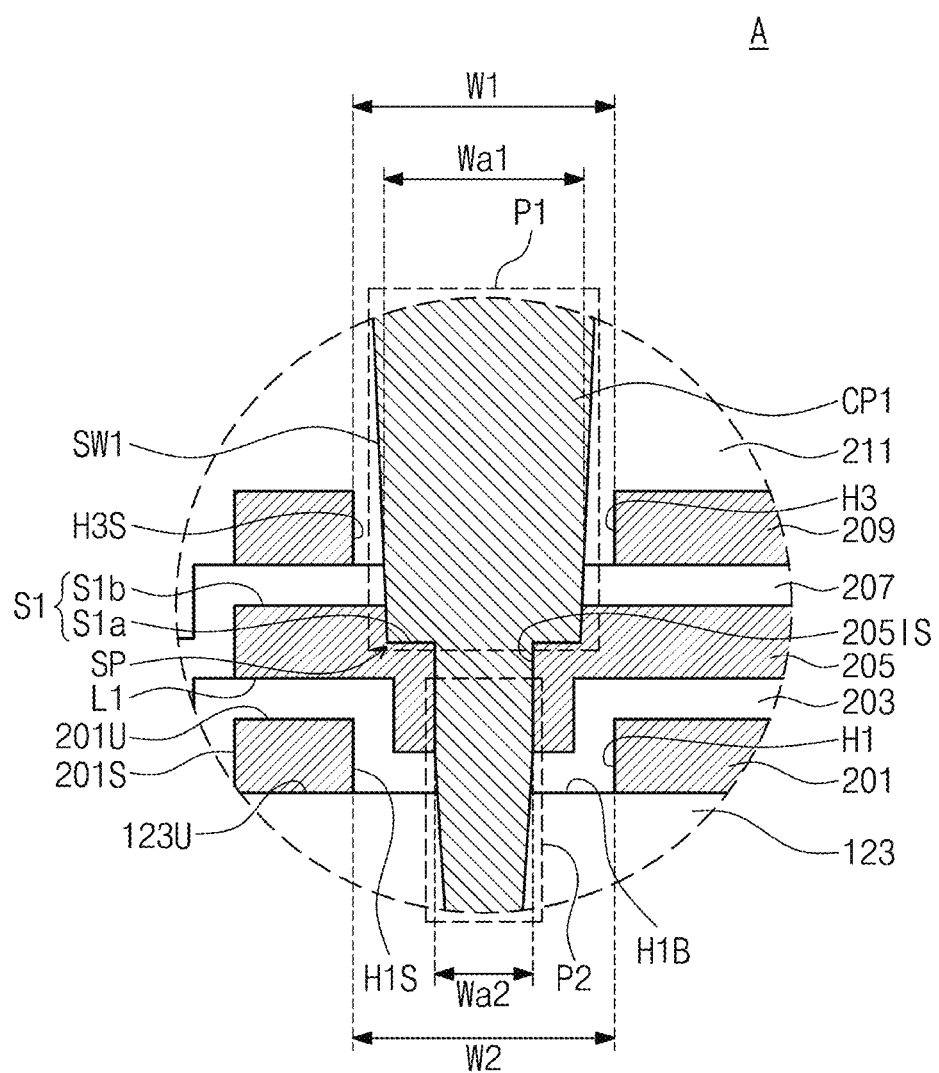
FIG. 3A is an enlarged view of portion A of FIG. 2.
Figure 3B:
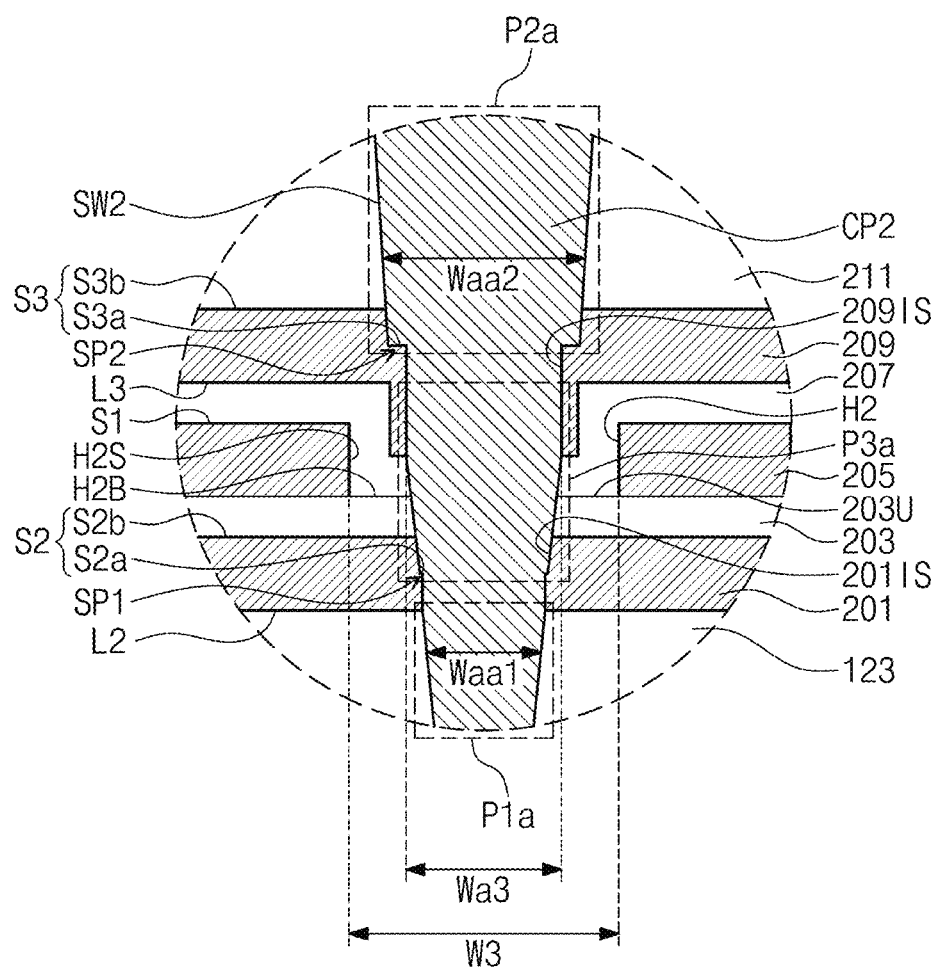
FIG. 3B is an enlarged view of portion B of FIG. 2.

FIG. 1 is a plan view illustrating a semiconductor device according to some example embodiments of the inventive concepts. FIG. 2 is a cross-sectional view taken along line I-I' of FIG. 1, illustrating a semiconductor device according to some example embodiments of the inventive concepts. FIG. 3A is an enlarged view of portion A of FIG. 2. FIG. 3B is an enlarged view of portion B of FIG. 2.

Referring to FIGS. 1 and 2, a first interlayer insulation layer 101 may be disposed on an upper surface of a substrate 100. The substrate 100 may be, for example, a silicon monocrystalline wafer or a silicon on insulator (SOI) substrate. The first interlayer insulation layer 101 may include an insulating material, for example, silicon oxide or silicon nitride. A first lower wiring layer 103 may be disposed in the first interlayer insulation layer 101. An upper surface of the first lower wiring layer 103 may be coplanar with an upper surface of the first interlayer insulation layer 101. The first lower wiring layer 103 may include metal, for example, copper, aluminum, or tungsten. A first buffer insulation layer 105 may be disposed on the upper surface of the first interlayer insulation layer 101. The first buffer insulation layer 105 may cover a portion of the upper surface of the first lower wiring layer 103 and the whole upper surface of the first interlayer insulation layer 101. The first buffer insulation layer 105 may include, for example, silicon carbonitride (SiCN).

A second interlayer insulation layer 107 may be disposed on the first buffer insulation layer 105. The second interlayer insulation layer 107 may cover an upper surface of the first buffer insulation layer 105. The second interlayer insulation layer 107 may include an insulating material, for example, silicon oxide or silicon nitride. A second buffer insulation layer 109 may be disposed on the second interlayer insulation layer 107. The second buffer insulation layer 109 may cover an upper surface of the second interlayer insulation layer 107. The second buffer insulation layer 109 may include, for example, silicon carbonitride (SiCN). A third interlayer insulation layer 111 may be disposed on the second buffer insulation layer 109. The third interlayer insulation layer 111 may cover an upper surface of the second buffer insulation layer 109. The third interlayer insulation layer 111 may include an insulating material, for example, silicon oxide or silicon nitride.

It will be understood that, as described herein, an element that is "on" another element may be above or beneath the other element. Additionally, an element that is "on" another element may be directly on the other element, such that the element is in direct contact with at least a portion of the other element, or may be indirectly on the other element, such that the element is isolated from direct contact with the other element by one or more interposing structures and/or spaces.

A second lower wiring layer 113 may be disposed in the second buffer insulation layer 109 and the third interlayer insulation layer 111. The second lower wiring layer 113 may penetrate the third interlayer insulation layer 111 and the second buffer insulation layer 109. An upper surface of the second lower wiring layer 113 may be coplanar with an upper surface of the third interlayer insulation layer 111. The second lower wiring layer 113 may include metal, for example, copper, aluminum, or tungsten. A third lower wiring layer 115 may be disposed in the third interlayer insulation layer 111 and the second buffer insulation layer 109. The third lower wiring layer 115 may penetrate the third interlayer insulation layer 111 and the second buffer insulation layer 109. The third lower wiring layer 115 may be spaced apart from the second lower wiring layer 113. An upper surface of the third lower wiring layer 115 may be coplanar with the upper surface of the third interlayer insulation layer 111. The third lower wiring layer 115 may include metal, for example, copper, aluminum, or tungsten. A fourth lower wiring layer 117 may be disposed in the second buffer insulation layer 109 and the third interlayer insulation layer 111. The fourth lower wiring layer 117 may penetrate the third interlayer insulation layer 111 and the second buffer insulation layer 109. The fourth lower wiring layer 117 may penetrate the third interlayer insulation layer 111 and the second buffer insulation layer 109. The fourth lower wiring layer 117 may be spaced apart from the second and third lower wiring layers 113 and 115. An upper surface of the fourth lower wiring layer 117 may be coplanar with the upper surface of the third interlayer insulation layer 111.

The fourth lower wiring layer 117 may be electrically connected to a resistor. The fourth lower wiring layer 117 may include metal, for example, copper, aluminum, or tungsten. A conductive through via 119 may disposed between the first lower wiring layer 103 and the third lower wiring layer 115. The conductive through via 119 may penetrate the first buffer insulation layer 105 and the second interlayer insulation layer 107. The conductive through via 119 may contact the first lower wiring layer 103 and the third lower wiring layer 115 and may electrically connect therebetween. The conductive through via 119 may include metal, for example, copper, aluminum, or tungsten.

A third buffer insulation layer 121 may be disposed on the third interlayer insulation layer 111. The third buffer insulation layer 121 may cover the upper surfaces of the second to fourth lower wiring layers 113, 115, and 117 and the upper surface of the third interlayer insulation layer 111. The third buffer insulation layer 121 may include, for example, silicon carbonitride (SiCN). A fourth interlayer insulation layer 123 may be disposed on the third buffer insulation layer 121. A thickness of the fourth interlayer insulation layer 123 may be greater than a thickness of each of the first to third interlayer insulation layers 101, 107, and 111. The fourth interlayer insulation layer 123 may include an insulating material, for example, silicon oxide or silicon nitride.

A first electrode 201 may be disposed on and may contact an upper surface 123U of the fourth interlayer insulation layer 123, such that the first through fourth interlayer insulation layers 101, 107, 111, and 123 are between an upper surface 100U of the substrate 100 and the first electrode 201. The first electrode 201 may be vertically overlapped with the second and third lower wiring layers 113 and 115. The first electrode 201 may not be disposed on the fourth lower wiring layer 117. The first electrode 201 may include a first hole H1 therein. The first hole H1 may be vertically overlapped with the second lower wiring layer 113 (e.g., overlapped in a vertical direction that is perpendicular to the upper surface 100U of the substrate 100). The first hole H1 may expose a portion of the upper surface of the fourth interlayer insulation layer 123. The first electrode 201 may include, for example, TaN, Ta, Al, Ti, TiN, TaSiN, WN, and/or WSiN.

A first dielectric layer 203 may be disposed on the first electrode 201. As shown in FIG. 2 and FIG. 3A, the first dielectric layer 203 may be on and may cover an upper surface 201U and sidewalls 201S of the first electrode 201. The first dielectric layer 203 may be disposed on a bottom surface H1B and a sidewall H1S of the first hole H1. That is, the first dielectric layer 203 may be on, may contact, and thus may cover the portion of the upper surface 123U of the fourth interlayer insulation layer 123 exposed by the first hole H1. The first dielectric layer 203 may include, for example, Si3N4, Ta2O5, Al2O3, and/or ZrO2. As shown in at least FIG. 3A, the first dielectric layer 203 may include a portion that fills at least a portion of the first hole H1, for example filling a limited portion of the first hole H1 such that a remainder portion of the first hole H1 is not filled by the first dielectric layer 203.

A second electrode 205 may be disposed on the first dielectric layer 203. The second electrode 205 may cover a portion of an upper surface of the first dielectric layer 203. The second electrode 205 may vertically overlapped with the second and third lower wiring layers 113 and 115. The second electrode 205 may not be disposed on the fourth lower wiring layer 117. The second electrode 205 may fill the first hole H1 of the first electrode 201 in which the first dielectric layer 203 is disposed. For example, as shown in FIG. 3A, the second electrode 205 may include a portion that fills the remainder portion of the first hole H1 that is not filled by at least the portion of the first dielectric layer 203. The second electrode 205 may include a second hole H2 therein. The second hole H2 may be vertically overlapped with the third lower wiring layer 115. The second hole H2 may expose a portion of the upper surface of the first dielectric layer 203. The second electrode 205 may include, for example, TaN, Ta, Al, Ti, TiN, TaSiN, WN, and/or WSiN.

A second dielectric layer 207 may be disposed on the second electrode 205. The second dielectric layer 207 may cover an upper surface and sidewalls of the second electrode 205. The second dielectric layer 207 may be disposed a bottom surface H2B and a sidewall H2S of the second hole H2. As shown in at least FIG. 3B, the second dielectric layer 207 may include a portion that fills at least a portion of the second hole H2, for example filling a limited portion of the second hole H2 such that a remainder portion of the second hole H2 is not filled by the second dielectric layer 207. The second dielectric layer 207 may cover the portion of the upper surface of the first dielectric layer 203 exposed by the second hole H2. The second dielectric layer 207 may contact the upper surface 203U of the first dielectric layer 203 in the second hole H2. The second dielectric layer 207 may contact the upper surface 203U of the first dielectric layer 203 over the fourth lower wiring layer 117. The second dielectric layer 207 may include, for example, Si3N4, Ta2O5, Al2O3, and/or ZrO2.

A third electrode 209 may be disposed on the second dielectric layer 207. The third electrode 209 may cover an upper surface and sidewalls of the second dielectric layer 207. For example, as shown in FIG. 3B, the third electrode 209 may include a portion that fills the remainder portion of the second hole H2 that is not filled by the portion of the second dielectric layer 207. The third electrode 209 may vertically overlapped with the second and third lower wiring layers 113 and 115. The third electrode 209 may not be disposed on the fourth lower wiring layer 117. The third electrode 209 may include a third hole H3 therein. As shown in FIG. 3A third hole H3 may be partially or entirely vertically overlapped (e.g., partially or entirely overlapped in the direction perpendicular to the upper surface 100U of the substrate 100) with the first hole H1 of the first electrode 201. The third hole H3 may expose a portion of the upper surface of the second dielectric layer 207. The third electrode 209 may fill the second hole H2 of the second electrode 205 in which the second dielectric layer 207 is disposed. The third electrode 209 may include, for example, TaN, Ta, Al, Ti, TiN, TaSiN, WN, and/or WSiN. A fifth interlayer insulation layer 211 may be disposed on the third electrode 209. The fifth interlayer insulation layer 211 may cover the third electrode 209 and the second dielectric layer 207. The fifth interlayer insulation layer 211 may fill the third hole H3. The fifth interlayer insulation layer 211 may include an insulating material, for example, silicon oxide or silicon nitride.

Referring to FIGS. 2 and 3A, a first contact plug CP1 may extend (e.g., penetrate) through the first hole H1 of the first electrode 201 and the third hole H3 of the third electrode 209. The first contact plug CP1 may extend through the fifth interlayer insulation layer 211, the second electrode 205, the first dielectric layer 203, the second dielectric layer 207, the fourth interlayer insulation layer 123, and the third buffer insulation layer 121. As shown in FIG. 3A, the first contact plug CP1 may extend through the portion of the first dielectric layer 203 that fills a portion of the first hole H1 and the portion of the second electrode 205 that fills the remainder portion of the first hole H1 that is not filled by the first dielectric layer 203. The first contact plug CP1 may contact the second electrode 205 and the second lower wiring layer 113. The first contact plug CP1 may be electrically connected to the second electrode 205 and the second lower wiring layer 113. As shown in FIG. 3A, an upper surface S1 of the second electrode 205 may have a stepped profile. For example, as shown in FIG. 3A, a portion S1a of the upper surface S1 of the second electrode 205 covered by the first contact plug CP1 may be a portion recessed from a portion S1b of the upper surface S1 of the second electrode 205 covered (e.g., overlapped in a vertical direction that is perpendicular to the upper surface 100U of the substrate 100) by the second dielectric layer 207. The first contact plug CP1 may contact the portion S1a of the upper surface S1 of the second electrode 205 and, as shown in FIG. 3A, may cover the portion S1a of the upper surface S1 of the second electrode 205. The first contact plug CP1 may be physically spaced apart from (e.g., isolated from direct contact with) and electrically insulated from both the first and third electrodes 201 and 209.

The first contact plug CP1 may include a first part P1 and a second part P2. The first part P1 may be at least partially disposed on the recessed upper surface S1 of the second electrode 205 (e.g., at least partially distal from the upper surface 100U of the substrate 100 in relation to the upper surface S1). The second part P2 may be at least partially disposed below a lower surface L1 of the second electrode 205 (e.g., at least partially between the lower surface L1 and the upper surface 100U of the substrate 100) in contact with an uppermost surface of the first dielectric layer 203. The second part P2 may be at least partially disposed below an upper surface S1 of the second electrode 205 (e.g., at least partially between the upper surface S1 and the upper surface 100U of the substrate 100). The first part P1 may extend through the third hole H3 of the third electrode 209, and the second part P2 may extend through the first hole H1 of the first electrode 201. A width Wa1 of the first part P1 extending through the third hole H3 may be less than a width W1 of the third hole H3. The first part P1 may be spaced apart from a sidewall of the third hole H3. A width Wa2 of the second part P2 extending through the first hole H1 may be less than a width W2 of the first hole H1. The second part P2 may be spaced apart from the sidewall of the first hole H1. For example, a portion of the first dielectric layer 203 may be interposed between the second part P2 and the sidewall of the first hole H1.

The first conductive plug CP1 may have a sidewall SW1. As shown in FIG. 3A, the sidewall SW1 of the first contact plug CP1 may be physically spaced apart from (e.g., isolated from direct contact with) and electrically insulated from both the first and third electrodes 201 and 209, for example based at least in part upon being directly covered by portions of the first dielectric layer 203, the second electrode 205, and the second dielectric layer 207, and physically isolated from direct contact with sidewalls H3S of the third hole H3. The sidewall SW1 of the first conductive plug CP1 may have a step portion SP. As shown in FIG. 3A, the step portion SP of the sidewall SW1 of the first conductive plug CP1 may be located adjacent to the upper surface S1 of the second electrode 205, (e.g., located between the uppermost surface S1 of the second electrode 205 and the lower surface L1 of the second electrode 205). The portion S1a of the upper surface S1 and an internal sidewall 205IS of the second electrode 205 may contact (e.g., directly contact) the step portion SP of the sidewall SW1 of the conductive plug CP1. As shown in FIG. 3A, the sidewall SW1 of the first part P1 of the first contact plug CP1 may be offset to the sidewall SW1 of the second part P2 of the first contact plug CP1, such that a step change (e.g., discontinuous change in width) in the sidewall SW1 is present between the first and second parts P1 and P2 (e.g., at the step portion SP). A width Wa1 of the first part P1 of the first contact plug CP1 may be greater than a width Wa2 of a second part P2 of the first contact plug CP1. The width Wa1 of the first part P1 of the contact plug CP1 may be gradually (e.g., continuously) decreased in proportion to increasing proximity to the second part P2 and/or in proportion to increasing proximity to the second electrode 205. The width of the second part P2 of the contact plug CP1 may be gradually (e.g., continuously) decreased in proportion to increasing proximity to an upper surface 100U of the substrate 100. The first contact plug CP1 may have T-shape. The first contact plug CP1 may include, for example, copper, aluminum, or tungsten.

Referring to FIGS. 2 and 3B, a second contact plug CP2 may extend (e.g., penetrate) through the second hole H2 of the second electrode 205. The second contact plug CP2 may extend (e.g., penetrate) through the fifth interlayer insulation layer 211, the third electrode 209, the second dielectric layer 207, the first dielectric layer 203, the first electrode 201, and the fourth interlayer insulation layer 123, and the third buffer insulation layer 121. The second contact plug CP2 may physically and electrically contact (e.g., directly contact) the third electrode 209, the first electrode 201, and the third lower wiring layer 115. The second contact plug CP2 may be physically spaced apart from (e.g., isolated from direct contact with) and electrically insulated from the second electrode 205. An upper surface S2 of the first electrode 201 may have a stepped profile. For example, a portion of the upper surface S2 of the first electrode 201 covered by the second contact plug CP2 may be a portion recessed from the upper surface S2 of the first electrode 201 covered by the first dielectric layer 203. An upper surface S3 of the third electrode 209 may have a stepped profile. For example, a portion of the upper surface S3 of the third electrode 209 covered by the second contact plug CP2 may be a portion recessed from the upper surface S3 of the third electrode 209 covered by the fifth interlayer insulation layer 211.

The second contact plug CP2 may contact the portion of the upper surface S2 of the first electrode 201 and the portion of the upper surface S3 of the third electrode 209. The second contact plug CP2 may be spaced apart from a sidewall of the second hole H2. For example, a portion of the second dielectric layer 207 may be interposed between the sidewall of the second hole H2 and the second contact plug CP2. A portion of the third electrode 209 filling a portion of the second hole H2 may be interposed between the second contact plug CP2 and a portion of the second dielectric layer 207 in the second hole H2.

The second contact plug CP2 may include a first part P1a, a second part P2a and a third part P3a. As shown in FIG. 3B, the third part P3a may be between the first part P1a and the second part P2a. As shown in FIG. 3B, the first part P1a may be at least partially disposed below a lower surface L2 of the first electrode 201 (e.g., at least partially between the lower surface L2 and the upper surface 100U of the substrate 100). As shown in FIG. 3B, the first part P1a may be at disposed below an upper surface S2 of the first electrode 201 (e.g., between the upper surface S2 and the upper surface 100U of the substrate 100). As shown in FIG. 3B, the second part P2a may be at least partially disposed on the recessed upper surface S3 of the third electrode 209 (e.g., at least partially distal from the upper surface 100U of the substrate 100 in relation to the upper surface S3 of the third electrode 209).

The third part P3a may be at least partially disposed between a lower surface L3 of the third electrode 209 and the recessed upper surface S2 of the first electrode 201. The third part P3a may extend through the second hole H2 and may penetrate (e.g., extend) through both the first dielectric layer 203 and the second dielectric layer 207. As shown in FIG. 3B, for example, the third part P3a may extend through the portion of the second dielectric layer 207 that fills a portion of the second hole H2 and the portion of the third electrode 209 that fills the remainder portion of the second hole H2 that is not filled by the second dielectric layer 207. As shown in FIG. 3B, a portion of the third electrode 209 may be between the second dielectric layer 207 and the second contact plug CP2 and may further be at least partially within the second hole H2 such that the portion of the third electrode 209 at least partially fills the second hole H2. A width Wa3 of the third part P3a extending through the second hole H2 may be less than a width W3 of the second hole H2. As shown in FIG. 3B, a width Waa2 of the second part P2a may be greater than a width Waa1 of the first part P1a and a width Wa3 of the third part P3a. The width Wa3 of the third part P3a may be greater than the width Waa1 of the first part P1a. That is, the width Waa1 of the first part P1a may be less than the width Waa2 of the second part P2a and the width Wa3 of the third part P3a. The width Waa2 of the second part P2a may be gradually (e.g., continuously) decreased in proportion to proximity to the third part P3a. The width Waa1 of the first part P1a may be gradually (e.g., continuously) decreased in proportion to proximity to the upper surface 100U of the substrate 100.

The second contact plug CP2 may have a sidewall SW2. The sidewall SW2 of the second contact plug CP2 may have a plurality of step portions SP1 and SP2. A first step portion SP1 may be located adjacent to the upper surface S2 of the first electrode 201. A portion S2a of the upper surface S2 and an inner sidewall 201IS of the first electrode 201 may contact the first step portion SP1 of the sidewall SW2 of the second contact plug CP2, and thus the third part P3a may cover the portion S2a of the upper surface S2 of the first electrode 201. The first step portion SP1 may be located between the lower surface L2 of the first electrode 201 and the upper surface S2 of the first electrode 201. Specifically, the first step portion SP1 may be located between the lower surface L2 of the first electrode 201 and the uppermost surface S2 of the first electrode 201 covered (e.g., overlapped in a vertical direction that is perpendicular to the upper surface 100U of the substrate 100) by the first dielectric layer 203 (e.g., the portion S2b of the upper surface S2). A second step portion SP2 may be located adjacent to the upper surface S3 of the third electrode 209. A portion S3a of the upper surface S3 and an inner sidewall 209IS of the third electrode 209 may contact the second step portion SP2 of the sidewall SW2 of the second contact plug CP2, and thus the second part P2a may cover the portion S3a of the upper surface S3 of the third electrode 209. The second step portion SP2 may be located between the lower surface L3 of the third electrode 209 and the upper surface S3 of the third electrode 209. Specifically, the second step portion SP2 may be located between the lower surface L3 of the third electrode 209 and the uppermost surface S3 of the third electrode 209 covered (e.g., overlapped in a vertical direction that is perpendicular to the upper surface 100U of the substrate 100) by the fifth interlayer insulation layer 211 (e.g., the portion S3b of the upper surface S3). As shown in FIG. 3B, the sidewall SW2 of the first part P1a of the second contact plug CP2 may be offset to the sidewall SW2 of the third part P3a of the second contact plug CP2, such that a step change (e.g., discontinuous change in width) in the sidewall SW2 is present between the first and third parts P1a and P3a (e.g., at the step portion SP1). As shown in FIG. 3B, the sidewall SW2 of the third part P3a of the second contact plug CP2 may be offset to the sidewall SW2 of the second part P2a of the second contact plug CP2, such that a step change (e.g., discontinuous change in width) in the sidewall SW2 is present between the second and third parts P2a and P3a (e.g., at the step portion SP2). The second contact plug CP2 may include metal, for example, copper, aluminum, or tungsten.

According to some example embodiments of the inventive concepts, the first contact plug CP1 may cover the portion S1a of the upper surface S1 of the second electrode 205, and may contact the second electrode 205. The second contact plug CP2 may cover the portions S2a and S3a of the upper surfaces S2 and S3 of the first and third electrodes 201 and 209, and may contact the first and third electrodes 201 and 209. Accordingly, the second contact plug CP2 may cover at least one of an upper surface of the first electrode 201 (e.g., portion S2a) and an upper surface of the third electrode 209 (e.g., portion S3a). A contact area between the first contact plug CP1 and the second electrode 205 may increase, and a contact area between the second contact plug CP2 and each of the first and third electrodes 201 and 209 may increase. Accordingly, a resistance of each of the first and second contact plugs CP1 and CP2 may be reduced.

Referring again to FIG. 2, a third contact plug CP3 may contact the fourth lower wiring layer 117. The third contact plug CP3 may extend through the third buffer insulation layer 121, the fourth interlayer insulation layer 123, the first and second dielectric layers 203 and 207, and the fifth interlayer insulation layer 211, and may contact the upper surface of the fourth lower wiring layer 117 to be electrically connected to the fourth lower wiring layer 117. The third contact plug CP3 may include metal, for example, copper, aluminum, or tungsten.

A first upper wiring layer 221, a second upper wiring layer 223, and a third upper wiring layer 225 may be disposed on the fifth interlayer insulation layer 211. The first upper wiring layer 221 may be disposed on an upper surface of the first contact plug CP1 and may be electrically connected to the first contact plug CP1. The second upper wiring layer 223 may be disposed on an upper surface of the second contact plug CP2 and may be electrically connected to the second contact plug CP2. The third upper wiring layer 225 may be disposed on an upper surface of the third contact plug CP3 and may be electrically connected to the third contact plug CP3.

Figure 4:
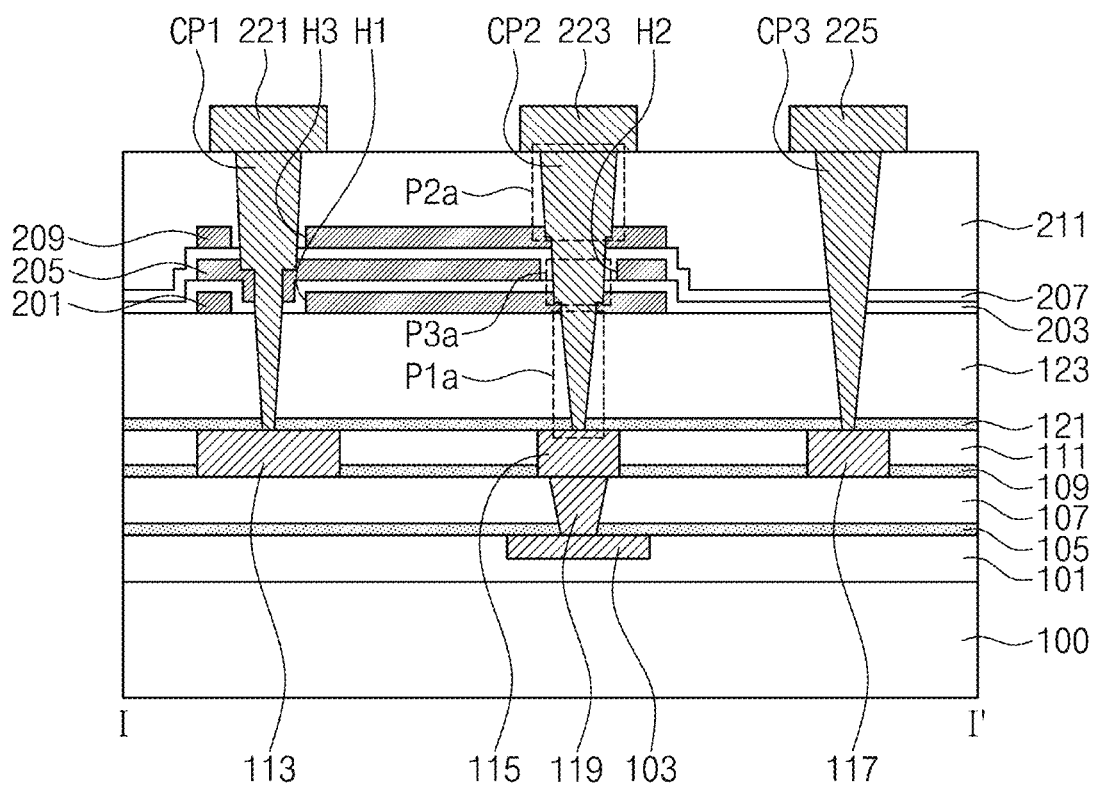
FIG. 4 is a cross-sectional view taken along line I-I' of FIG. 1, illustrating a semiconductor device according to some example embodiments of the inventive concepts.

FIG. 4 is a cross-sectional view taken along line I-I' of FIG. 1, illustrating a semiconductor device according to some example embodiments of the inventive concepts.

Referring to FIG. 4, the third part P3a of the second contact plug CP2 extending through the second hole H2 of the second electrode 205 may contact a portion of the second dielectric layer 207 covering the sidewall of the second hole H2. For example, a portion of the third electrode 209 may not be disposed between the third part P3a of the second contact plug CP2 and the portion of the second dielectric layer 207 covering the sidewall of the second hole H2. That is, unlike that shown in FIG. 2, a portion of the third electrode 209 may not fill the second hole H2.

Figure 5:
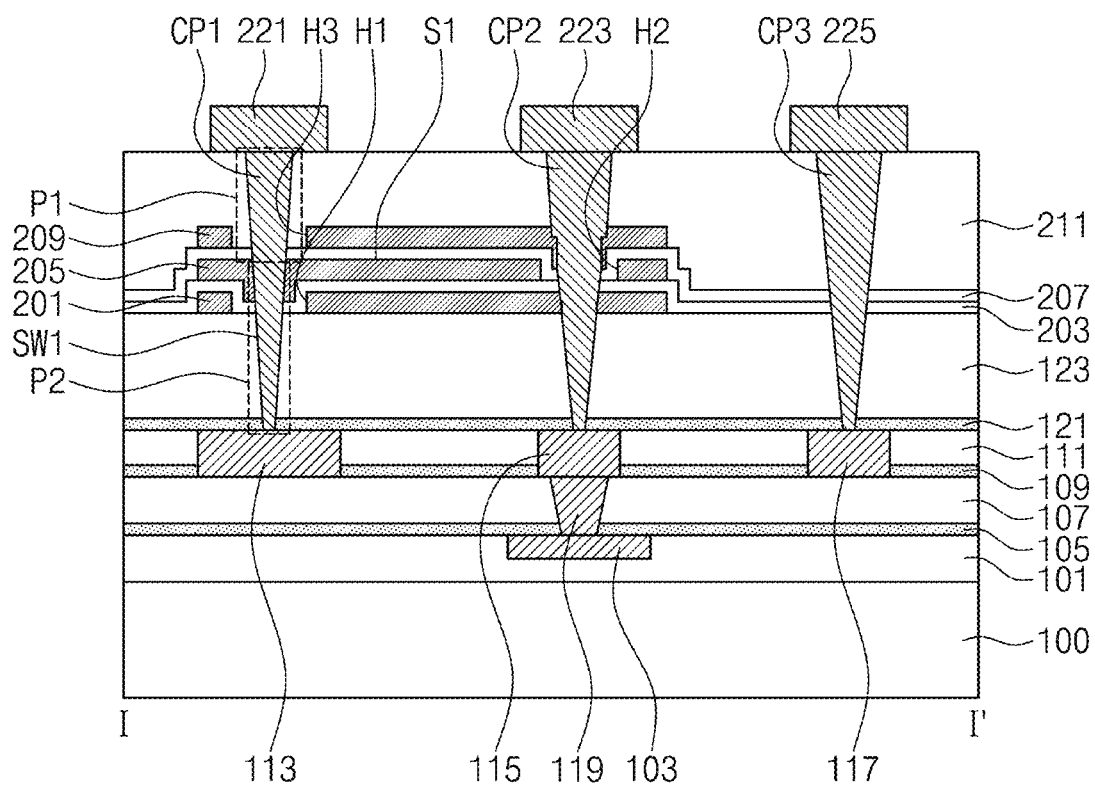
FIG. 5 is a cross-sectional view taken along line I-I' of FIG. 1, illustrating a semiconductor device according to some example embodiments of the inventive concepts.

FIG. 5 is a cross-sectional view taken along line I-I' of FIG. 1, illustrating a semiconductor device according to some example embodiments of the inventive concepts.

Referring to FIG. 5, the first contact plug CP1 may include the first part P1 on the upper surface S1 of the second electrode 205 and the second part P2 below the upper surface S1 of the second electrode 205. The first contact plug CP1 may extend through and contact the second electrode 205, but may not cover the upper surface S1 of the second electrode 205. For example, the sidewall SW1 of the first contact plug CP1 may be even. That is, the sidewall SW1 of the first part P1 of the first contact plug CP1 may be aligned with the sidewall SW1 of the second part P2 of the first contact plug CP1. As shown in FIG. 5, the sidewall SW1 of the first part P1 and the sidewall SW1 of the second part P2 may be inclined respect to the upper surface 100U of the substrate 100. The sidewall SW1 of the first part P1 and the sidewall SW1 of the second part P2 may be obliquely aligned with each other. In some embodiments, the sidewall SW1 of the first part P1 and the sidewall SW1 of the second part P2 may be perpendicular to the upper surface 100U of the substrate 100. That is, the sidewall SW1 of the first part P1 and the sidewall SW1 of the second part P2 may be vertically aligned with each other (e.g., aligned in a vertical direction that is perpendicular to the upper surface 100U of the substrate 100). The first contact plug CP1 may have a tapered cross-section or rectangular cross-section.

Figure 6:
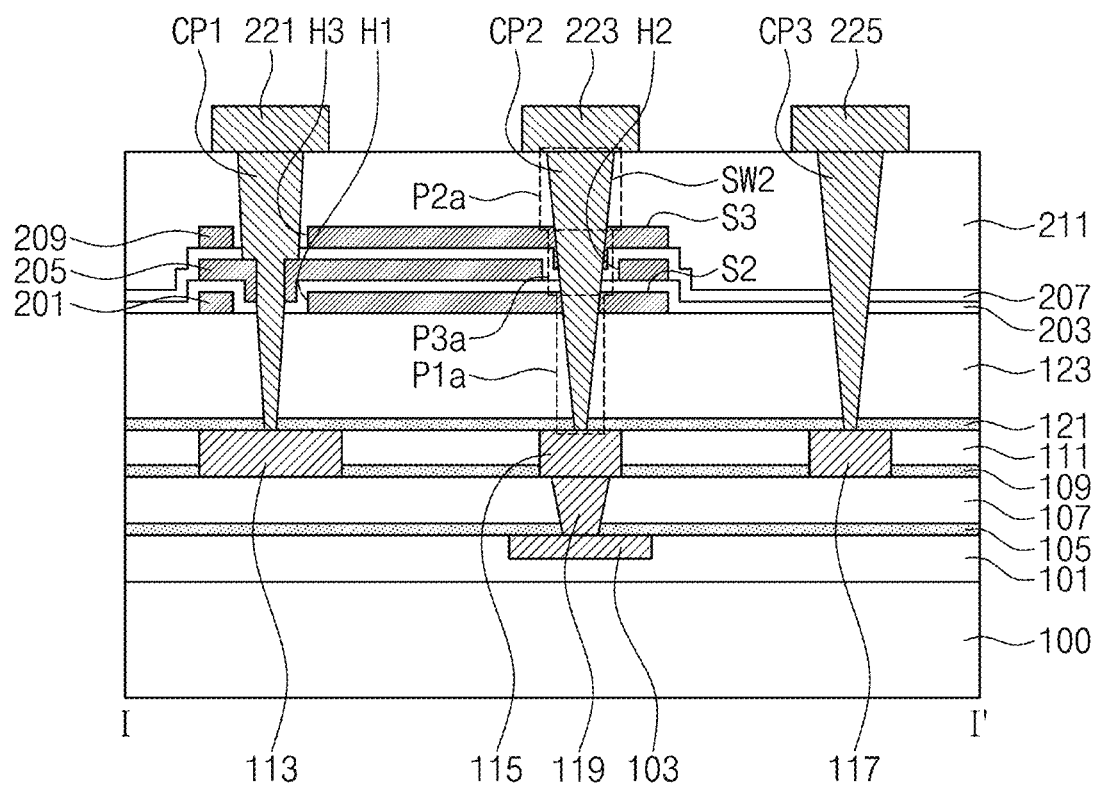
FIG. 6 is a cross-sectional view taken along line I-I' of FIG. 1, illustrating a semiconductor device according to some example embodiments of the inventive concepts.

FIG. 6 is a cross-sectional view taken along line I-I' of FIG. 1, illustrating a semiconductor device according to some example embodiments of the inventive concepts.

Referring to FIG. 6, the second contact plug CP2 may include the first part P1a, the second part P2a and the third part P3a. The first part P1a may be disposed below the upper surface S2 of the first electrode 201. The second part P2a may be disposed on the upper surface S3 of the third electrode 209. The third part P3a may be disposed between the first part P1a and the second part P2a. The second contact plug CP2 may extend through the first and third electrodes 201 and 209 and may contact the first and third electrodes 201 and 209, but may not cover the upper surface S2 of the first electrode 201 and the upper surface S3 of the third electrode 209. For example, the sidewall SW2 of the second contact plug CP2 may be even. That is, in the second contact plug CP2, the sidewall SW2 of the first part P1a, the sidewall SW2 of the second part P2a and the sidewall SW2 of the third part P3a may be aligned with each other, for example as shown in FIG. 6, such that the sidewall SW2 of the first part P1a, the sidewall SW2 of the second part P2a and the sidewall SW2 of the third part P3a define separate portions of a surface of an individual, continuous three-dimensional geometric shape (e.g., separate portions of a single cone shape or conical surface, as shown in FIG. 6).

As shown in FIG. 6, in the second contact plug CP2, the sidewall SW2 of the first part P1a, the sidewall SW2 of the second part P2a and the sidewall SW2 of the third part P3a may be inclined with respect to the upper surface 100U of the substrate 100, and may be obliquely aligned with each other. In some embodiments, in the second contact plug CP2, the sidewall SW2 of the first part P1a, the sidewall SW2 of the second part P2a and the sidewall SW2 of the third part P3a may be perpendicular to the upper surface 100U of the substrate 100, and may be vertically aligned with each other (e.g., aligned in a vertical direction that is perpendicular to the upper surface 100U of the substrate 100). The second contact plug CP2 may have a tapered cross-section or rectangular cross-section.

FIGS. 7A, 7B, 7C, 7D, 7E, 7F, and 7G illustrate a method of manufacturing a semiconductor device according to some example embodiments of the inventive concepts and are cross-sectional views taken along line I-I' of FIG. 1.

Figure 7A:
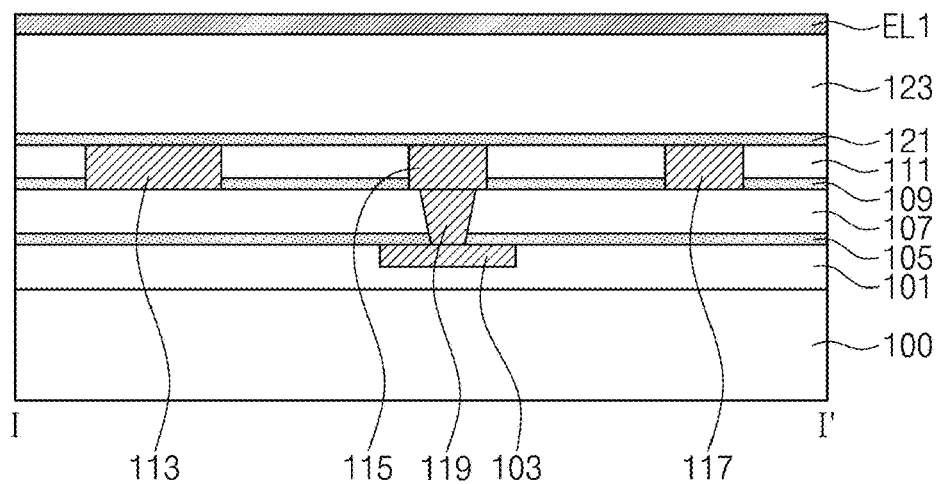
FIGS. 7A, 7B, 7C, 7D, 7E, 7F, and 7G illustrate a method of manufacturing a semiconductor device according to some example embodiments of the inventive concepts and are cross-sectional views taken along line I-I' of FIG. 1.

Referring to FIG. 7A, the first interlayer insulation layer 101 may be formed on the substrate 100. The first lower wiring layer 103 may be formed in the first interlayer insulation layer 101. An upper surface of the first lower wiring layer 103 may be coplanar with an upper surface of the first interlayer insulation layer 101. The first buffer insulation layer 105 may be formed on the upper surface of the first interlayer insulation layer 101. The first buffer insulation layer 105 may cover a portion of the upper surface of the first lower wiring layer 103. The second interlayer insulation layer 107 may be formed to cover an upper surface of the first buffer insulation layer 105. The conductive through via 119 may be formed to extend through the first buffer insulation layer 105 and the second interlayer insulation layer 107. The conductive through via 119 may contact the upper surface of the first lower wiring layer 103. The second buffer insulation layer 109 and the third interlayer insulation layer 111 may be sequentially formed on an upper surface of the second interlayer insulation layer 107. The second lower wiring layer 113, the third lower wiring layer 115, and the fourth lower wiring layer 117 may be disposed in the second buffer insulation layer 109 and the third interlayer insulation layer 111. The third lower wiring layer 115 may contact an upper surface of the conductive through via 119. Upper surfaces of the second to fourth lower wiring layers 113, 115, and 117 may be coplanar with an upper surface of the third interlayer insulation layer 111.

The third buffer insulation layer 121 may be formed on the upper surface of the third interlayer insulation layer 111. The third buffer insulation layer 121 may cover the upper surface of the third interlayer insulation layer 111 and the upper surfaces of the second to fourth lower wiring layers 113, 115, and 117. The fourth interlayer insulation layer 123 may be formed to cover an upper surface of the third buffer insulation layer 121. A first electrode layer EL1 may be formed on an upper surface of the fourth interlayer insulation layer 123. The first electrode layer EL1 may include, for example, TaN, Ta, Al, Ti, TiN, TaSiN, WN, and/or WSiN.

Figure 7B:
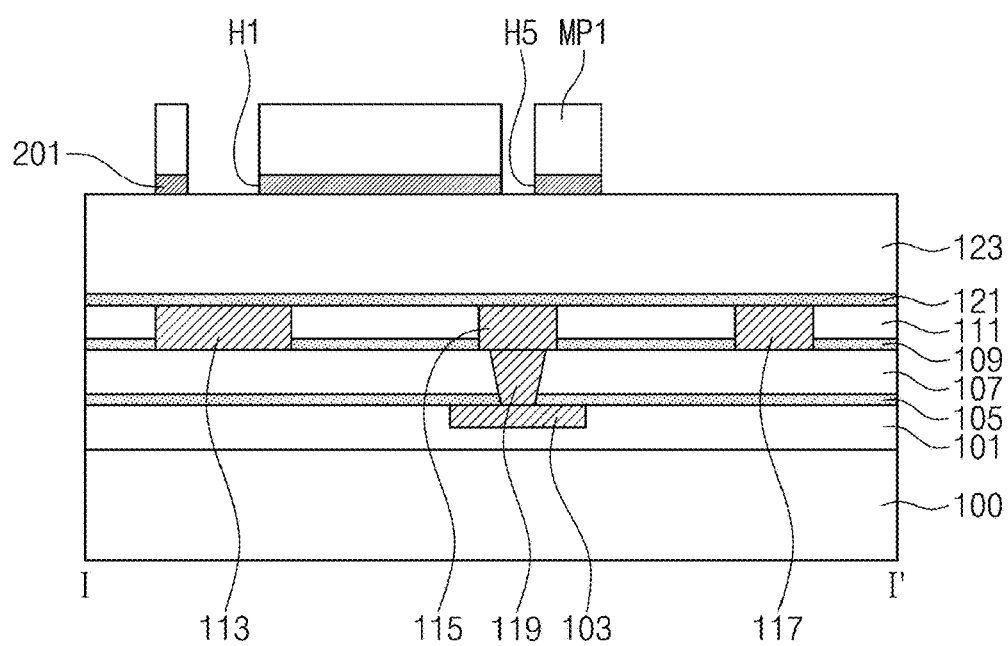

Referring to FIG. 7B, a first mask pattern MP1 may be formed on the first electrode layer ELL The first electrode layer EL1 may be patterned using the first mask pattern MP1 as an etch mask to form the first electrode 201. The first mask pattern MP1 may be, for example, a photoresist pattern. A portion of the upper surface of the fourth interlayer insulation layer 123 may be exposed by the patterning process of the first electrode layer EL1 The first electrode 201 may include the first hole H1 and a fifth hole H5. The first hole H1 may be formed to be vertically overlapped with the second lower wiring layer 113 (e.g., overlapped in a vertical direction that is perpendicular to the upper surface 100U of the substrate 100). The fifth hole H5 may be formed to be vertically overlapped with the third lower wiring layer 115. The patterning process of the first electrode layer EL1 may be performed by a dry etching process, for example. After the patterning process of the first electrode layer EL1 is performed, the first mask pattern MP1 may be removed by, for example, an ashing process or a strip process.

Figure 7C:
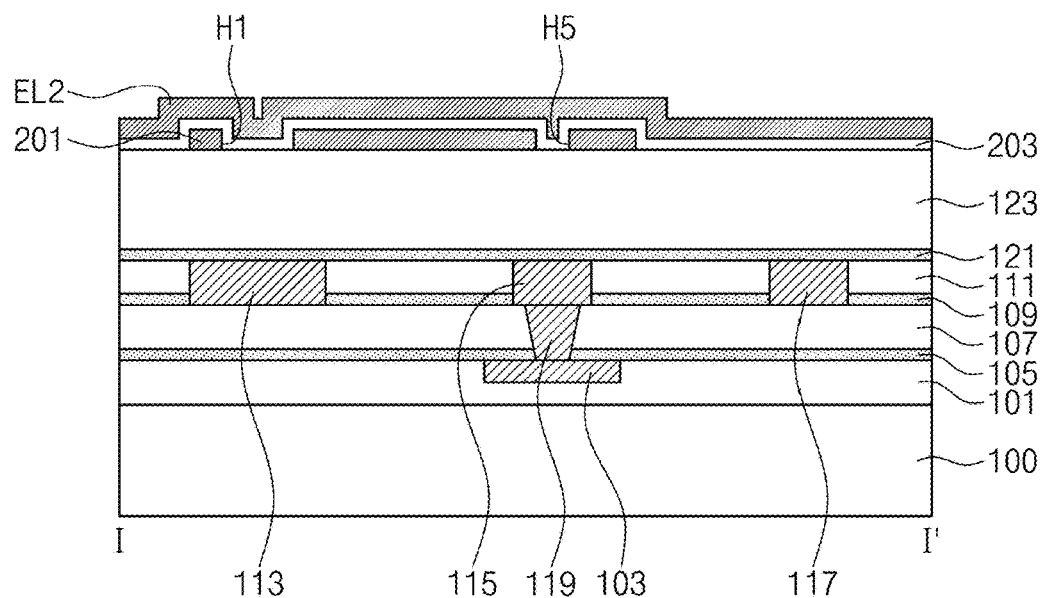

Referring to FIG. 7C, the first dielectric layer 203 may be formed on the first electrode 201 and the fourth interlayer insulation layer 123. The first dielectric layer 203 may conformally cover an upper surface and sidewalls of the first electrode 201 and the upper surface of the fourth interlayer insulation layer 123. The first dielectric layer 203 may be formed to cover a bottom surface and a sidewall of the first hole H and a bottom surface and a sidewall of the third hole H5. For example, the first dielectric layer 203 may conformally cover the sidewall of the first hole H1 and a portion of the upper surface of the fourth interlayer insulation layer 123 exposed by the first hole H1. For example, the first dielectric layer 203 may conformally cover the sidewall of the fifth hole H5 and a portion of the upper surface of the fourth interlayer insulation layer 123 exposed by the fifth hole H5. The first dielectric layer 203 may include, for example, Si3N4, Ta2O5, Al2O3, and/or ZrO2.

A second electrode layer EL2 may be formed on the first dielectric layer 203. The second electrode layer EL2 may cover an upper surface of the first dielectric layer 203. The second electrode layer EL2 may fill the first hole H1 in which the first dielectric layer 203 is formed and the fifth hole H5 in which the first dielectric layer 203 is formed. The second electrode layer EL2 may include, for example, TaN, Ta, Al, Ti, TiN, TaSiN, WN, and/or WSiN.

Figure 7D:
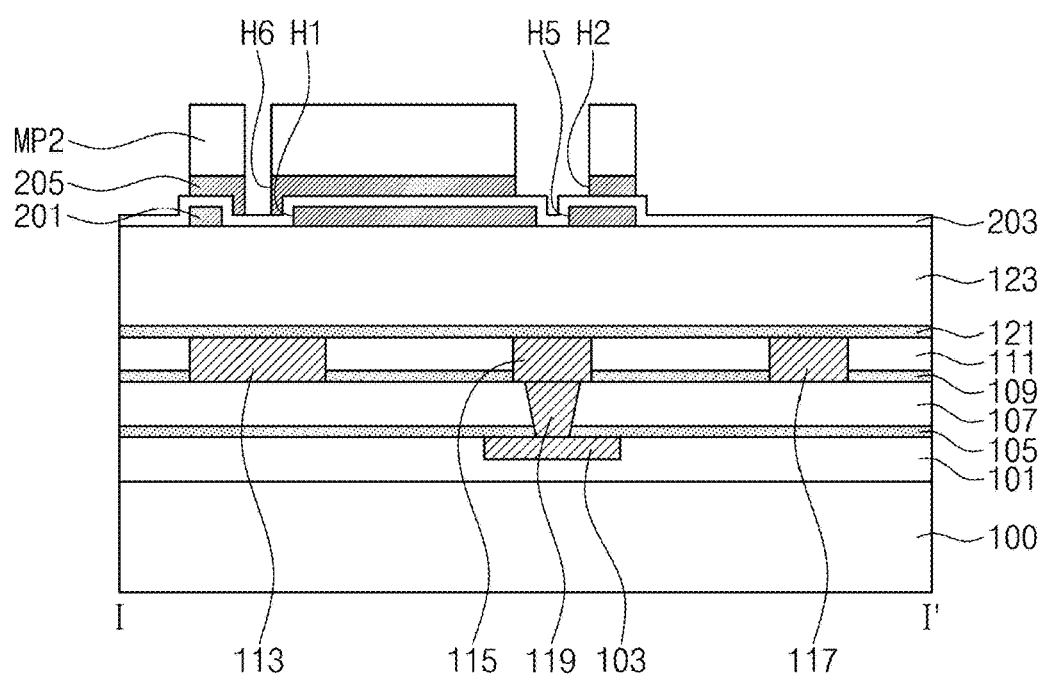

Referring to FIG. 7D, a second mask pattern MP2 may be formed on the second electrode layer EL2. The second electrode layer EL2 may be patterned using the second mask pattern MP2 as an etch mask to form the second electrode 205. The second mask pattern MP2 may be, for example, a photoresist pattern. The second electrode 205 may expose a portion of the upper surface of the first dielectric layer 203. The second electrode 205 may include the second hole H2 and a sixth hole H6. The second hole H2 may be formed to be vertically overlapped with the fifth hole H5 of the first electrode 201. The sixth hole H6 may be formed to be vertically overlapped with the first hole H1 of the first electrode 201. As an example, a width of the second hole H2 of the second electrode 205 may be greater than a width of the fifth hole H5 of the first electrode 201, and a width of the sixth hole H6 of the second electrode 205 may be less than a width of the first hole H1 of the first electrode 201.

A portion of the second electrode layer EL2 filling the fifth hole H5 of the first electrode 201 may be removed by the patterning process. Thus, a portion of the first dielectric layer 203 may be exposed by the second hole H2. A portion of the second electrode layer EL2 filling the first hole H1 may be removed by the patterning process. A portion of the upper surface of the first dielectric layer 203 may be exposed by the sixth hole H6 of the second electrode 205. After the patterning process of the second electrode layer EL2 is performed, a portion of the second electrode 205 may remain on a portion of the second dielectric layer 207 covering the sidewall of the first hole H1. The patterning process of the second electrode layer EL2 may be performed by a dry etching process, for example. After the patterning process of the second electrode layer EL2 is performed, the second mask pattern MP2 may be removed. The second mask pattern MP2 may be removed by, for example, an ashing process or a strip process.

Figure 7E:
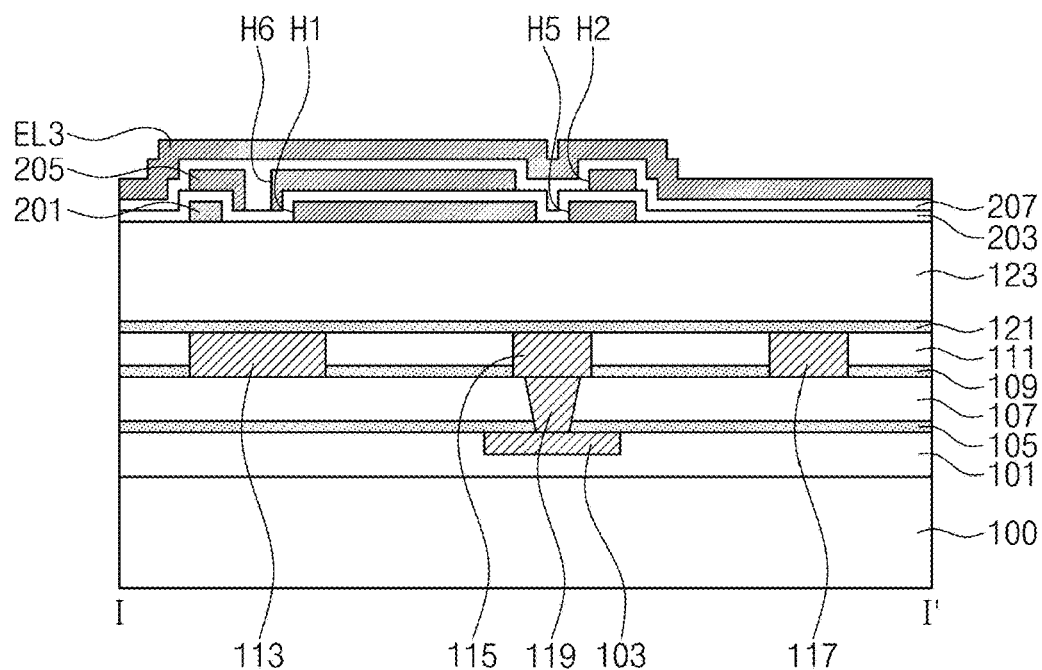

Referring to FIG. 7E, the second dielectric layer 207 may be formed on the second electrode 205. The second dielectric layer 207 may conformally cover an upper surface and sidewalls of the second electrode 205, a portion of the upper surface of the first dielectric layer 203 exposed by the second electrode 205, and an inner surface of the second hole H2 of the second electrode 205. The second dielectric layer 207 may fill the sixth hole H6 of the second electrode 205. The second dielectric layer 207 may include, for example, $Si_3N_4$, $Ta_2O_5$, $Al_2O_3$, and/or $ZrO_2$. A third electrode layer EL3 may be formed on the second dielectric layer 207. The third electrode layer EL3 may conformally cover an upper surface of the second dielectric layer 207 and may fill the second hole H2 in which the second dielectric layer 207 is formed. The third electrode layer EL3 may include, for example, TaN, Ta, Al, Ti, TiN, TaSiN, WN, and/or WSiN.

Figure 7F:
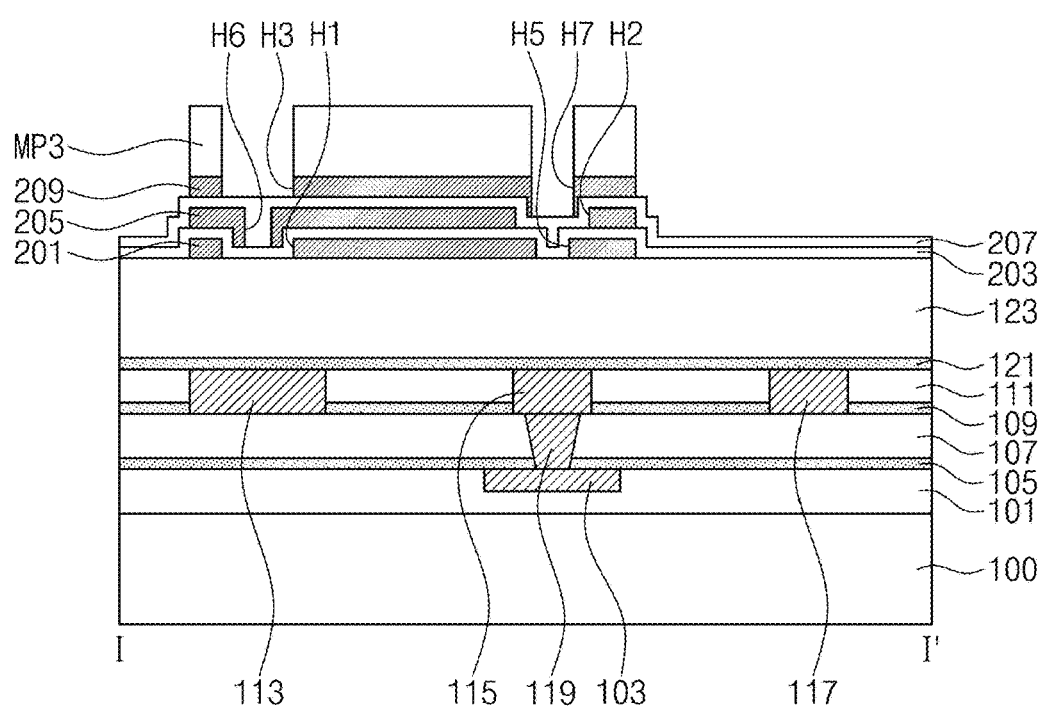

Referring to FIG. 7F, a third mask pattern MP3 may be formed on the third electrode layer EL3. The third electrode layer EL3 may be patterned using the third mask pattern MP3 as an etch mask to form the third electrode 209. The third mask pattern MP3 may be, for example, a photoresist pattern. The third electrode 209 may expose a portion of the upper surface of the second dielectric layer 207. The third electrode 209 may include the third hole H3 and a seventh hole H7. The third hole H3 may be formed to be vertically overlapped with the sixth hole H6 of the second electrode 205 and the first hole H1 of the first electrode 201. The seventh hole H7 may be formed to be vertically overlapped with the second hole H2 of the second electrode 205 and the fifth hole H5 of the first electrode 201. As an example, a width of the third hole H3 of the third electrode 209 may be greater than the width of the sixth hole H6 of the second electrode 205, and a width of the seventh hole H7 of the third electrode 209 may be less than the width of the second hole H2 of the second electrode 205.

A portion of the third electrode layer EL3 filling the second hole H2 of the second electrode 205 may be removed by the patterning process. Thus, a portion of the upper surface of the second dielectric layer 207 may be exposed by the seventh hole H7 of the third electrode 209. After the patterning process of the third electrode layer EL3 is performed, a portion of the third electrode 209 may remain on a portion of the second dielectric layer 207 covering the sidewall of the second hole H2. A portion of the upper surface of the second dielectric layer 207 may be exposed buy the third hole H3 of the third electrode 209. The patterning process of the third electrode layer EL3 may be performed by a dry etching process, for example. After the patterning process of the third electrode layer EL3 is performed, the third mask pattern MP3 may be removed. The third mask pattern MP3 may be removed by, for example, an ashing process or a strip process.

Figure 7G:
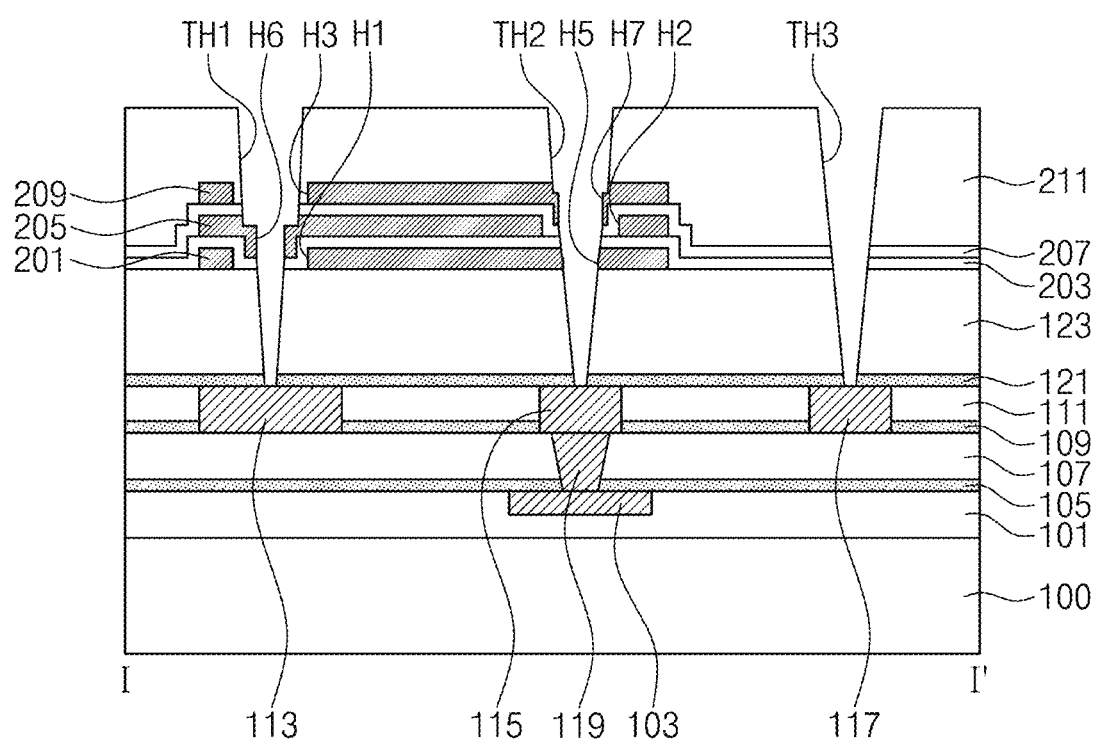

Referring to FIG. 7G, the fifth interlayer insulation layer 211 may be formed on the third electrode 209 and the second dielectric layer 207. The fifth interlayer insulation layer 211 may be formed to fill the third hole H3 and the seventh hole H7 of the third electrode 209. The fifth interlayer insulation layer 211 may cover an upper surface and sidewalls of the third electrode 209 and the upper surface of the second dielectric layer 207.

A first through hole TH1, a second through hole TH2, and a third through hole TH3 may be formed. The first through hole TH1 may be formed to pass through the fifth interlayer insulation layer 211, the second electrode 205, the second dielectric layer 207, the first dielectric layer 203, the fourth interlayer insulation layer 123, and the third buffer insulation layer 121. The first through hole TH1 may be formed in the first hole H1 of the first electrode 201, the sixth hole H6 of the second electrode 205, and the third hole H3 of the third electrode 209. A portion of the upper surface and an inner sidewall of the second electrode 205 may be exposed by the first through hole TH1. A width of the first through hole TH1 formed on the upper surface of the second electrode 205 may be less than the width of the third hole H3 of the third electrode 209 and may be greater than the width of the sixth hole H6 of the second electrode 205. A width of the first through hole TH1 formed below the upper surface of the second electrode 205 may be less than the width of the first hole H1 of the first electrode 201. A width of the first through hole TH1 below the upper surface of the second electrode 205 may be less than the width of the first hole H1 of the first electrode 201. The first through hole TH1 may not expose the first electrode 201 and the third electrode 209. The first through hole TH1 may expose a portion of the upper surface of the second lower wiring layer 113.

The second through hole TH2 may be formed to pass through the fifth interlayer insulation layer 211, the third electrode 209, the second dielectric layer 207, the first dielectric layer 203, the first electrode 201, the fourth interlayer insulation layer 123, and the third buffer insulation layer 121. The second through hole TH2 may be formed in the fifth hole H5 of the first electrode 201, the second hole H2 of the second electrode 205, and the seventh hole H7 of the third electrode 209. The second through hole TH2 may expose a portion of an upper surface and an inner sidewall of the third electrode 209 and a portion of the upper surface and an inner sidewall of the first electrode 201. A width of the second through hole TH2 formed on the upper surface of the third electrode 209 may be greater than the width of the seventh hole H7 of the third electrode 209. A width of the second through hole TH2 formed on the upper surface of the first electrode 201 may be greater than the width of the fifth hole H5 of the first electrode 201. The second through hole TH2 may not expose the second electrode 205. The second through hole TH2 may expose a portion of the upper surface of the third lower wiring layer 115.

The third through hole TH3 may pass through the fifth interlayer insulation layer 211, the first and second dielectric layers 203 and 207, the fourth interlayer insulation layer 123, and the third buffer insulation layer 121. The third through hole TH3 may expose a portion of the upper surface of the fourth lower wiring layer 117. The first through hole TH1, the second through hole TH2, and the third through hole TH3 may be formed by an etching process. The etching process may be performed using an etch recipe for etching the fifth interlayer insulation layer 211, the first and second dielectric layers 203 and 207, the fourth interlayer insulation layer 123, and the third buffer insulation layer 121. The etch recipe may have an etch selectivity with respect to the first to third electrodes 201, 205, and 209 and the second to fourth lower wiring layers 113, 115, and 117. The etching process may be performed by, for example, a dry etching process.

Referring again to FIG. 2. the first contact plug CP1, the second contact plug CP2, and the third contact plug CP3 may be formed. The first contact plug CP1 may be formed in the first through hole TH1. The second contact plug CP2 may be formed in the second through hole TH2. The third contact plug CP3 may be formed in the third through hole TH3. The first contact plug CP1 may be formed to cover the portion of the upper surface and the sidewall of the second electrode 205 exposed by the first through hole TH1. The second contact plug CP2 may be formed to cover the portion of the upper surface and the sidewall of the third electrode 209 and the portion of the upper surface and the sidewall of the first electrode 201 that are exposed by the second through hole TH2. The first to third upper wiring layers 221, 223, and 225 may be formed on the first to third contact plugs CP1, CP2, and CP3, respectively. For example, the first upper wiring layer 221 may be formed on an upper surface of the first contact plug CP1. The second upper wiring layer 223 may be formed on an upper surface of the second contact plug CP2. The third upper wiring layer 225 may be formed on an upper surface of the third contact plug CP3.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A semiconductor device, comprising:
   a substrate;
   a first electrode including a first hole;
   a first dielectric layer on an upper surface of the first electrode and filling at least a portion of the first hole;
   a second electrode on the first dielectric layer;
   a second dielectric layer on the second electrode;
   a third electrode on the second dielectric layer, the third electrode including a second hole; and
   a first contact plug extending through the first hole, the second electrode, the second dielectric layer, and the second hole,
   wherein a sidewall of the first contact plug is isolated from direct contact with the first electrode and the third electrode, the sidewall of the first contact plug has a step portion, and
   wherein the step portion of the sidewall of the first contact plug is a discontinuous change in a width of the first contact plug, the step portion is adjacent to an upper surface of the second electrode such that the discontinuous change in the width of the first contact plug is between an uppermost surface of the second electrode and a lower surface of the second electrode.

2. The semiconductor device according to claim 1, wherein,
   a lowermost surface of the second electrode is between the upper surface of the first electrode and a lower surface of the first electrode, and
   the upper surface of the first electrode is parallel to an upper surface of the substrate.

3. The semiconductor device according to claim 1, wherein the step portion of the sidewall of the first contact plug contacts a portion of the upper surface of the second electrode.

4. The semiconductor device according to claim 1, further comprising:
   a second contact plug extending through the first electrode, the first dielectric layer, the second dielectric layer and the third electrode, the second contact plug contacting the first electrode and the third electrode, the second contact plug isolated from direct contact with the second electrode,
   wherein a sidewall of the second contact plug has a plurality of step portions.

5. The semiconductor device according to claim 1, further comprising:
   a second contact plug extending through the first electrode, the first dielectric layer, the second dielectric layer and the third electrode, the second contact plug contacting the first electrode and the third electrode, the second contact plug isolated from direct contact with the second electrode,
   wherein the second contact plug covers a portion of the upper surface of the first electrode and a portion of an upper surface of the third electrode.

6. The semiconductor device according to claim 1, further comprising:
   a second contact plug extending through the first electrode, the first dielectric layer, the second dielectric layer and the third electrode, the second contact plug contacting the first electrode and the third electrode, the second contact plug isolated from direct contact with the second electrode,
   wherein the second contact plug includes
      a first part between the upper surface of the first electrode and an upper surface of the substrate,
      a second part at least partially distal from the upper surface of the substrate in relation to an upper surface of the third electrode, and
      a third part between the first part and the second part, and
   wherein a sidewall of the first part, a sidewall of the second part, and a sidewall of the third part are aligned with each other to define separate portions of a surface of an individual, continuous three-dimensional geometric shape.

7. The semiconductor device according to claim 1, wherein
   the first contact plug includes
      a first part at least partially distal from an upper surface of the substrate in relation to the upper surface of the second electrode; and
      a second part at least partially between the lower surface of the second electrode and the upper surface of the substrate,
   a width of the first part continuously decreases in proportion to increasing proximity to the second electrode, and
   a width of the second part continuously decreases in proportion to increasing proximity to the upper surface of the substrate.

8. The semiconductor device according to claim 1, further comprising:
   an interlayer insulation layer between an upper surface of the substrate and the first electrode;
   a lower wiring layer between the interlayer insulation layer and the upper surface of the substrate; and
   a second contact plug extending through the interlayer insulation layer, the first dielectric layer and the second dielectric layer, the second contact plug contacting the lower wiring layer,
   wherein the first electrode is on and contacts an upper surface of the interlayer insulation layer, and
   a portion of the first dielectric layer is on and contacts a portion of the upper surface of the interlayer insulation layer.

9. A semiconductor device, comprising:
   a substrate;
   a first electrode on the substrate;
   a first dielectric layer on the first electrode;
   a second electrode on the first dielectric layer;
   a second dielectric layer on the second electrode;
   a third electrode on the second dielectric layer; and
   a first contact plug extending through and contacting the first electrode and the third electrode,
   wherein the first contact plug includes
      a first part at least partially between a lower surface of the first electrode and an upper surface of the substrate,
      a second part at least partially distal from the upper surface of the substrate in relation to an upper surface of the third electrode, and
      a third part at least partially between an upper surface of the first electrode and a lower surface of the third electrode,
   wherein a sidewall of the first part is offset to a sidewall of the third part such that a first discontinuous change in a width of the first contact plug is present between the first and third parts, wherein the sidewall of the third part is offset to a sidewall of the second part such that a second discontinuous change in the width of the first contact plug is present between the second and third parts.

10. The semiconductor device according to claim 9, wherein
the first contact plug is isolated from direct contact with the second electrode, and
the third part of the first contact plug extends through both the first dielectric layer and the second dielectric layer.

11. The semiconductor device according to claim 9, wherein
the second electrode includes a hole,
the second dielectric layer includes a first portion that fills a portion of the hole,
the third electrode includes a second portion that fills a remainder portion of the hole that is not filled by the second dielectric layer, and
the third part of the first contact plug extends through both the second portion of the third electrode and the first portion of the second dielectric layer.

12. The semiconductor device according to claim 9, wherein
the second part of the first contact plug covers a portion of the upper surface of the third electrode, and
the third part of the first contact plug covers a portion of the upper surface of the first electrode.

13. The semiconductor device according to claim 9, wherein
a width of the second part of the first contact plug is greater than a width of the third part of the first contact plug, and
the width of the third part of the first contact plug is greater than a width of the first part of the first contact plug.

14. The semiconductor device according to claim 9, further comprising:
a second contact plug extending through the second electrode and contacting the second electrode.

15. A semiconductor device, comprising:
a substrate;
a first electrode on the substrate;
a first dielectric layer on the first electrode;
a second electrode on the first dielectric layer, the second electrode including a first hole;
a second dielectric layer on the second electrode, the second dielectric layer at least partially filling the first hole;
a third electrode on the second dielectric layer; and
a first contact plug extending through the first electrode, the first dielectric layer, the first hole, and the third electrode,
wherein the first contact plug is in contact with both an upper surface of the first electrode and an upper surface of the third electrode,
wherein the upper surface of the first electrode and the upper surface of the third electrode are parallel to an upper surface of the substrate.

16. The semiconductor device according to claim 15, wherein a portion of the third electrode is between the second dielectric layer and the first contact plug, and at least partially fills the first hole.

17. The semiconductor device according to claim 15, wherein the second dielectric layer contacts an upper surface of the first dielectric layer.

18. The semiconductor device according to claim 15, further comprising:
a second contact plug,
wherein the first electrode includes a second hole,
wherein the third electrode includes a third hole vertically overlapped with the second hole,
wherein the second contact plug extends through the second hole, the first dielectric layer, the second electrode, the second dielectric layer and the third hole, and
wherein the second contact plug contacts the second electrode.

19. The semiconductor device according to claim 18, wherein the first dielectric layer fills at least a portion of the second hole.

20. The semiconductor device according to claim 18, wherein
the second contact plug is isolated from direct contact with the first electrode and the third electrode, and
the second contact plug covers a portion of an upper surface of the second electrode.

* * * * *